United States Patent
Nosaka et al.

(10) Patent No.: US 6,538,531 B2
(45) Date of Patent: Mar. 25, 2003

(54) MULTILAYERED LC COMPOSITE COMPONENT AND METHOD FOR ADJUSTING FREQUENCY OF THE SAME

(75) Inventors: Koji Nosaka, Moriyama (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/884,275

(22) Filed: Jun. 19, 2001

(65) Prior Publication Data

US 2002/0030563 A1 Mar. 14, 2002

(30) Foreign Application Priority Data

Jul. 31, 2000 (JP) .................................... 2000-231253

(51) Int. Cl.[7] .................................................. H03H 7/09
(52) U.S. Cl. .................... 333/174; 333/175; 333/185
(58) Field of Search ................................. 333/174, 175, 333/184, 185, 205, 177; 361/311

(56) References Cited

U.S. PATENT DOCUMENTS

| | | | | |
|---|---|---|---|---|
| 4,706,505 A | * | 11/1987 | Andrews | 333/204 |
| 4,800,348 A | * | 1/1989 | Rosar et al. | 333/202 |
| 4,975,664 A | * | 12/1990 | Ito et al. | 333/204 |
| 5,357,229 A | * | 10/1994 | Benton | 333/205 |
| 6,002,576 A | * | 12/1999 | Asakura et al. | 361/311 |
| 6,061,227 A | * | 5/2000 | Nogi | 333/185 |
| 6,064,351 A | * | 5/2000 | Mandai et al. | 343/700 MS |

FOREIGN PATENT DOCUMENTS

| | | |
|---|---|---|
| JP | 08-250960 | 9/1996 |
| JP | 09-036607 | 2/1997 |
| JP | 09191222 A | * 7/1997 |
| JP | 11284472 A | * 10/1999 |

* cited by examiner

*Primary Examiner*—Seungsook Ham
(74) *Attorney, Agent, or Firm*—Keating & Bennett, LLP

(57) ABSTRACT

A multilayered LC composite component in which a fine adjustment to a desired frequency can be performed, includes multilayered body sheets on which internal electrodes including capacitor electrodes and inductor electrodes are stacked via dielectric layers. On surfaces of the multilayered body sheets, there are disposed a ground internal electrode and input/output extraction electrodes. A trimming electrode is arranged on the multilayered body such that the trimming electrode is opposed to some of the internal electrodes and is electrically connected to the ground internal electrode. In order to make a rough frequency adjustment, insular electrodes are isolated from the trimming electrode by trimming grooves. Then, a coating material is filled in each of the trimming grooves to make a fine adjustment.

19 Claims, 4 Drawing Sheets

MULTILAYERED LC COMPOSITE COMPONENT AND METHOD FOR ADJUSTING FREQUENCY OF THE SAME

BACKGROUND OF THE INVENTION

1. Field of the Invention

The present invention relates to multilayered LC composite components such as multilayered LC filters and methods for adjusting the frequencies of the composite components.

2. Description of the Related Art

Conventional filters used in a mobile phone and other communications devices include a multilayered LC filter. The multilayered LC filter is a chip-shaped LC composite component formed by laminating internal electrodes including capacitor electrodes and inductor electrodes with dielectric layers. Such a multilayered LC filter is suitable for miniaturization.

On the other hand, in this kind of multilayered LC filter, uniformly setting the frequency characteristics of the filter is relatively difficult. Thus, after manufacturing the filter, frequency adjustments are required to be performed. Specifically, a trimming electrode opposing internal electrodes is first arranged on a surface of the multilayered LC filter, and next, a portion of the trimming electrode is removed via laser, or by sandblasting or some other cutting method, which is referred to as a so-called functional trimming method.

However, since there are limitations to a minimum cutting amount obtained by the cutting method adopted in the frequency adjustment method described above, it is difficult to finely adjust the frequency of the filter.

SUMMARY OF THE INVENTION

In order to overcome the problems described above, preferred embodiments of the present invention provide a multilayered LC composite component in which fine adjustments to a desired frequency can be easily and accurately made. Additionally, preferred embodiments of the present invention provide a method for adjusting the frequency of the composite component.

According to a first preferred embodiment of the present invention, a multilayered LC composite component includes a multilayered body having internal electrodes including capacitor electrodes and an inductor electrode which are laminated via dielectric layers, input/output external electrodes and a ground external electrode disposed on a surface of the multilayered body, a trimming electrode disposed on a surface of the multilayered body such that the trimming electrode is opposed to at least one of the internal electrodes and electrically connected to the ground external electrode, an isolated electrode that is separated from the trimming electrode by a trimming groove, and a coating material filled in the trimming groove, the coating material having a dielectric constant that is smaller than the dielectric constant of the dielectric layer.

With the above unique arrangement, the frequency of the multilayered LC composite component can be adjusted to a desired frequency by forming a capacitance between the internal electrodes and the trimming electrode, between the internal electrodes and the isolated electrode, and between the trimming electrode and the isolated electrode. In other words, first, a rough adjustment is made by forming the isolated electrode, which is separated from the trimming electrode, and next, a fine adjustment is made by filling the coating material in the trimming groove, with the result that the frequency of the multilayered LC composite component can be adjusted to the desired frequency.

In addition, in the multilayered LC composite component of this preferred embodiment of the present invention, the isolated electrode may be an insular electrode surrounded by the trimming electrode via the trimming groove. With this arrangement, since variations in a trimming area caused by the positional deviation of a trimming region are reduced, the trimming can be satisfactorily performed.

Furthermore, in the multilayered LC composite component according to this preferred embodiment of the present invention, the coating material may have a dielectric constant between about 1.5 and about 10. In this preferred embodiment of the present invention, since the fine adjustment is performed by applying the coating material, it is preferable that the dielectric constant of the coating material is small. On the other hand, when the dielectric constant is extremely small, the maximum of the varying range is limited. Thus, preferably, the minimum dielectric constant is about 1.5 or greater. In contrast, when the dielectric constant is excessively great, it is difficult to benefit from the effects of the fine adjustment. As a result, preferably, the maximum dielectric constant is about 10 or smaller.

Furthermore, according to a second preferred embodiment of the present invention, a method for adjusting the frequency of a multilayered LC composite component including a multilayered body in which internal electrodes having capacitor electrodes and an inductor electrode are laminated via dielectric layers, input/output external electrodes and a ground external electrode disposed on surfaces of the multilayered body, and a trimming electrode disposed on a surface of the multilayered body such that the trimming electrode is opposed to at least one of the internal electrodes and electrically connected to the ground external electrode, the method including the steps of making a primary adjustment in which trimming groove is formed in the trimming electrode to form the isolated electrode separated from the trimming electrode so that a capacitance between the trimming electrode and the internal electrode is reduced to be smaller than a capacitance for a desired frequency, and making a secondary adjustment in which a coating material having a dielectric constant that is smaller than the dielectric constant of the dielectric layer is filled in the trimming groove to slightly increase a capacitance between the trimming electrode and the isolated electrode so as to adjust to the desired frequency.

As mentioned above, in preferred embodiments of the present invention, the adjustment for obtaining the desired frequency is performed preferably via two steps including the primary adjustment as the rough adjustment and the secondary adjustment as the fine adjustment. That is, first, before the formation of the electrode isolated from the trimming electrode, the one capacitance is present between the trimming electrode and the internal electrode. Then, after the formation of the isolated electrode, two capacitances are generated, that is, the capacitance between the trimming electrode and the internal electrode and the capacitance between the internal electrode and the isolated electrode. This is the primary step for the adjustment forming the two capacitances. Specifically, since the isolated electrode separated by the trimming groove is a floating electrode that is disconnected from the ground external electrode, a potential difference between the isolated electrode and the internal electrode is smaller than a potential difference between the internal electrode and the trimming electrode connected to the ground external electrode. As a result, due to the smaller potential difference between the isolated electrode and the internal electrode, a synthesized capacitance obtained after the isolation is smaller than the capacitance obtained before the isolation. With the primary adjustment, the synthesized capacitance between the trimming electrode and the internal electrodes is temporarily smaller than the synthesized capacitance in which the desired frequency is obtainable.

Next, the secondary adjustment is performed by filling the coating material in at least the trimming groove. In other words, the coating material is applied on the multilayered body to generate a small amount of capacitance between the trimming electrode and the isolated electrode mutually opposing in a surface direction via the coating material. With the secondary adjustment, since the capacitance between the trimming electrode and the isolated electrode slightly increases, a synthesized capacitance obtained from the three capacitances also slightly increases. Thus, the temporarily reduced synthesized capacitance in the primary adjustment can be slightly increased in the secondary adjustment. Consequently, the synthesized capacitance can be closer to the capacitance for the desired frequency.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Next, a description will be given of a multilayered LC filter as an example of a multilayered LC composite component according to a first preferred embodiment of the invention.

Figure 1:
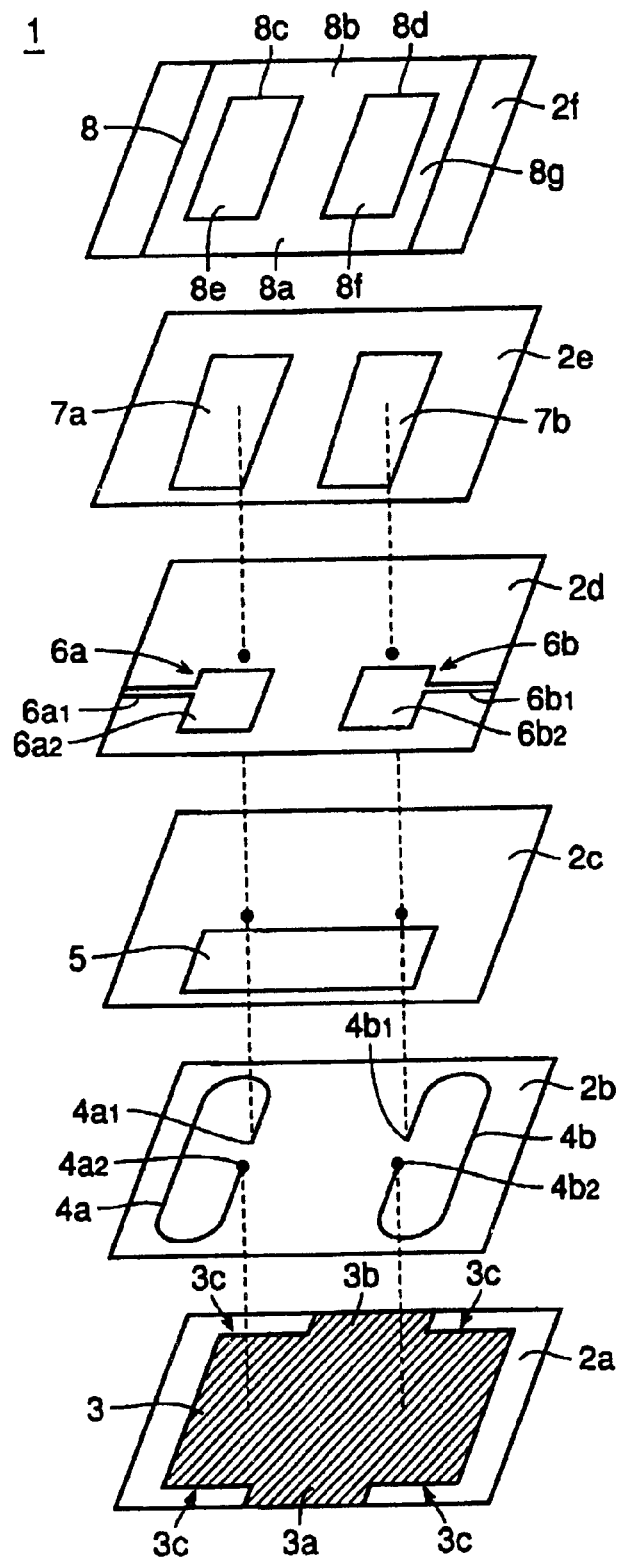
FIG. 1 shows an exploded perspective view illustrating a multilayered LC filter according to a first preferred embodiment of the present invention.
Figure 2:
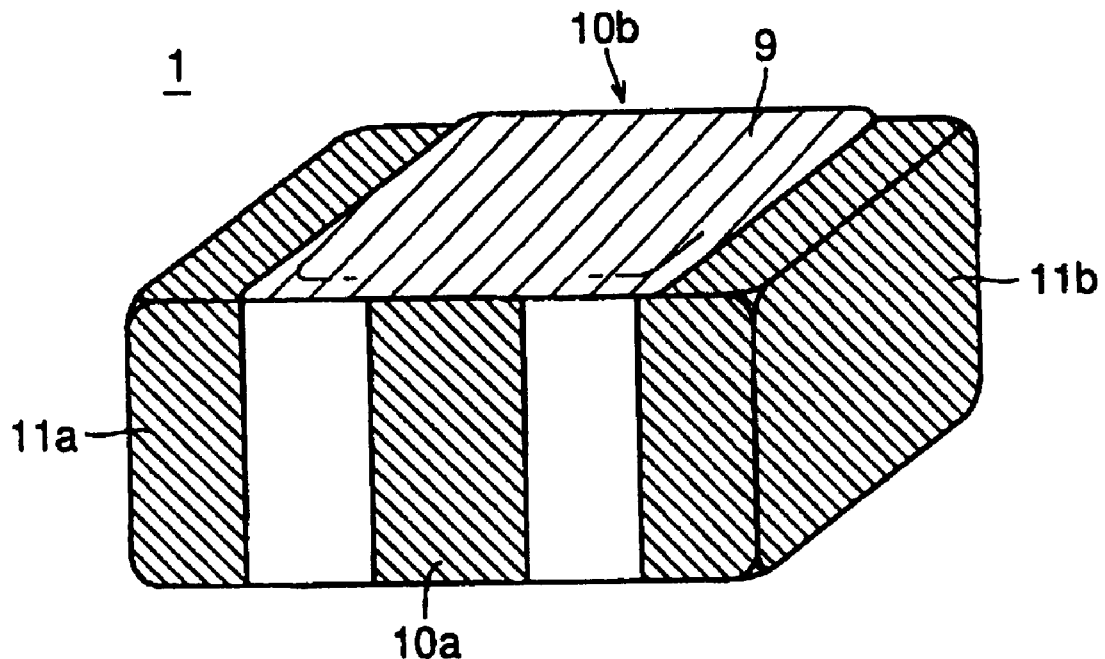
FIG. 2 shows a perspective view illustrating the appearance of the multilayered LC filter shown in FIG. 1.
Figure 3:
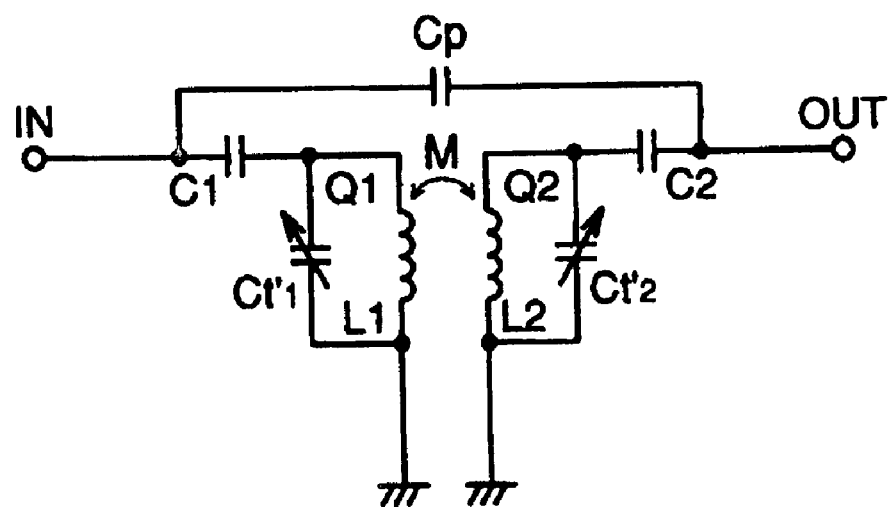
FIG. 3 shows an equivalent circuit diagram of the multilayered LC filter shown in FIG. 1.
Figure 4:
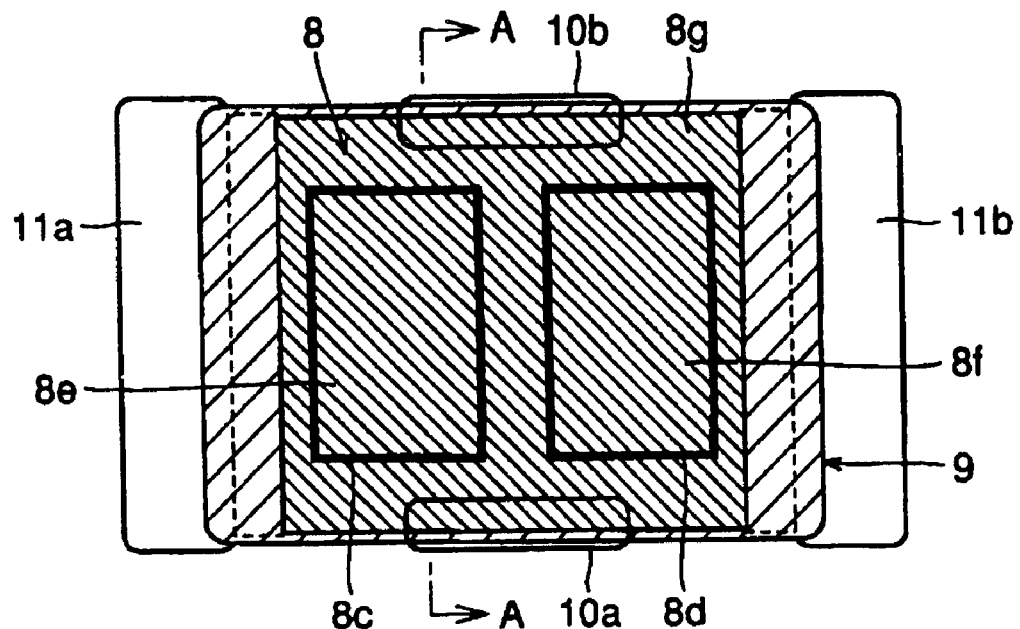
FIG. 4 shows a schematic plan view of the multilayered LC filter shown in FIG. 1.
Figure 5:
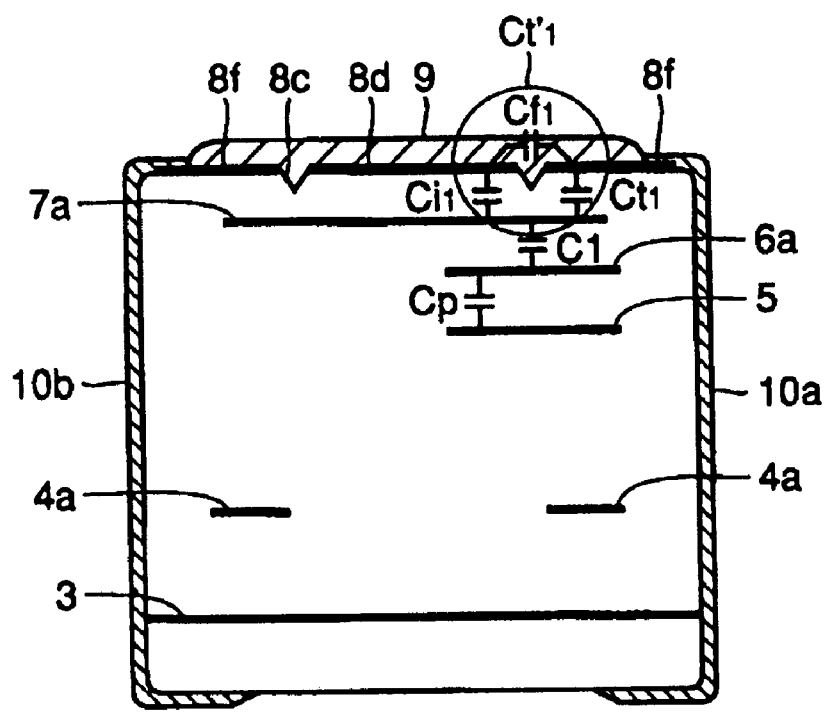
FIG. 5 shows a sectional view along the line A—A shown in FIG. 4.

FIG. 1 shows an exploded perspective view illustrating the multilayered LC filter of the present preferred embodiment of the present invention. FIG. 2 shows a perspective view for illustrating the appearance of the multilayered LC filter shown in FIG. 1. FIG. 3 shows an equivalent circuit diagram of the multilayered LC filter. FIG. 4 shows a schematic plan view of the multilayered LC filter. FIG. 5 shows a sectional view of the multilayered LC filter along the line A–A' shown in FIG. 4.

As shown in FIG. 1, a multilayered LC filter 1 includes a dielectric sheet 2a having a ground internal electrode 3 disposed thereon, a dielectric sheet 2b having a pair of inductor electrodes 4a and 4b disposed thereon, a dielectric sheet 2c having a coupling capacitor electrode 5 disposed thereon, a dielectric sheet 2d having an input extraction electrode 6a and an output extraction electrode 6b disposed thereon, a dielectric sheet 2e having resonance capacitor electrodes 7a and 7b disposed thereon, and a dielectric sheet 2f having a trimming electrode 8 disposed thereon. Each of the internal electrodes and the trimming electrode 8 is preferably made of Ag, Pd, Cu, Ni, Au, Ag—Pd, or other suitable material, and is formed by printing, sputtering, vapor deposition, or other suitable method. In addition, the dielectric sheets 2a to 2f are preferably sheet members formed by mixing dielectric powder with a binder.

The ground internal electrode 3 is disposed on the substantially entire top surface of the dielectric sheet 2a. One end 3a of the ground internal electrode 3 is exposed to the front edge of the dielectric sheet 2a, and the other end 3b is exposed to the back edge of the dielectric sheet 2a. On the outer peripheral region of the dielectric sheet 2a, there are disposed portions 3c where the ground internal electrode 3 is not formed to increase coupling strengths between the dielectric layers. When there is no concern about detachment, the ground internal electrode 3 may be disposed on the entire top surface of the dielectric sheet 2a.

Each of the inductor electrodes 4a and 4b is defined preferably by a coil of substantially one turn. The inductor electrode 4a is located closer to the left of the dielectric sheet 2b, and the inductor electrode 4b is located closer to the right of the dielectric sheet 2b. One end $4a_1$ of the inductor electrode 4a is connected to the resonance capacitor 7a by via-holes, and the other end $4a_2$ thereof is connected to the ground internal electrode 3 by another via-hole. Similarly, one end $4b_1$ of the inductor electrode 4b is connected to the resonance capacitor 7b by via-holes, and the other end $4b_2$ thereof is connected to the ground internal electrode 3 by another via-hole.

The coupling capacitor electrode 5 has a substantially rectangular shape having longer edge lines extending in the left-and-right direction of the dielectric sheet 2c. The coupling capacitor electrode 5 is disposed on the front of the substantially center of the dielectric sheet 2c. One end $6a_1$ of the input extraction electrode 6a is exposed to the left edge line of the dielectric sheet 2d, and the other end $6a_2$ thereof has a large area opposing the coupling capacitor electrode 5 via the electric sheet 2d and also opposing the resonance capacitor electrode 7a via the dielectric sheet 2e. Similarly, one end $6b_1$ of the output extraction electrode 6b is exposed to the right edge line of the dielectric sheet 2d, and the other end $6b_2$ thereof has a large area opposing the coupling capacitor electrode 5 via the electric sheet 2d and also opposing the resonance capacitor electrode 7b via the dielectric sheet 2e.

Each of the resonance capacitor electrodes 7a and 7b has a substantially rectangular shape having longer edge lines are extended in the front-and-back direction of the electric sheet 2e. The resonance capacitor electrode 7a is located closer to the left of the dielectric sheet 2e, and the resonance capacitor electrode 7b is located closer to the right of the dielectric sheet 2e. The resonance capacitor electrode 7a, as mentioned above, is connected to the one end $4a_1$ of the inductor electrode 4a, and is opposed to the input extraction electrode 6a. In addition, the resonance capacitor electrode 7a is also opposed to the trimming electrode 8 via the dielectric sheet 2f. Similarly, the resonance capacitor electrode 7b, as mentioned above, is connected to the one end $4b_1$ of the inductor electrode 4b and is opposed to the input extraction electrode 6b. In addition, the resonance capacitor electrode 7b is also opposed to the trimming electrode 8 via the dielectric sheet 2f.

The trimming electrode 8 is disposed on the substantially entire top surface of the dielectric sheet 2f in a manner that the electrode 8 covers at least the resonance capacitor electrodes 7a and 7b. One end 8a of the trimming electrode 8 is exposed to the front edge line of the dielectric sheet 2f, and the other end 8b thereof is exposed to the back edge line of the dielectric sheet 2f. Each of the trimming grooves 8c and 8d preferably has a substantially rectangular shape in the region of the trimming electrode 8. With this arrangement, insular electrodes 8e and 8f having substantially the same shape define isolated electrodes, which are isolated from the trimming electrode 8. The insular electrodes 8e and 8f are floating electrodes electrically disconnected from the ground external electrodes 10a and 10b. The electrodes 8e and 8f are substantially opposed to the resonance capacitor electrodes 7a and 7b via the dielectric sheet 2f.

The shapes of the trimming grooves 8c and 8d and the shapes of the insular electrodes 8e and 8f are preferably formed after the dielectric sheets are laminated to define a multi-layered body which will be described below. Additionally, the shape of each of the insular electrodes 8e and 8f is not limited to the above-described shape. Any shape, such as a substantially round or substantially triangular shape, can be used in the present invention, as long as the shape can define a region that is enclosed with each of the trimming grooves 8c and 8d.

After the dielectric sheets arranged as shown above are laminated in sequence, they are integrally burned to form the multilayered body. Then, as shown in FIG. 2, the ground external electrodes 10a and 10b are disposed on the front and back side-surfaces of the obtained multilayered body. In addition, on the right and left side-surfaces of the multilayered body, an input external electrode 11a and an output external electrode 11b are provided. These external electrodes are formed preferably by application/burning, sputtering, vapor deposition, or other suitable method. The ground external electrode 10a is connected to the one end 3a of the ground internal electrode 3 and the one end 8a of the trimming electrode 8. The ground external electrode 10b is connected to the other end 3b of the ground internal electrode 3 and the other end 8b of the trimming electrode 8. Additionally, the input external electrode 11a is connected to the one end $6a_1$ of the input extraction electrode 6a, and the output external electrode 11b is connected to the one end $6b_1$ of the output extraction electrode 6b.

A coating material 9 is applied on the substantially entire surfaces of the multilayered body. The coating material 9 is moisture-resistant and has a dielectric constant between approximately 1.5 and approximately 10. That is, the dielectric constant of the coating material 9 to be used is preferably smaller than the dielectric constant of the dielectric (for example, a dielectric constant between about 6 and about 50) of the multilayered body. In a composition for the coating material 9 having such a dielectric constant, for example, there is included acrylic resin (a dielectric constant between about 2.5 and about 4), epoxy resin (a dielectric constant between about 3 and about 6), silicone resin (a dielectric constant between about 3.5 and about 6.5), or other suitable material, as the main component, and according to the needs, an additive such as a hardening agent and an accelerator may be mixed therewith.

The dielectric constant may be adjusted by mixing an inorganic material such as a dielectric material as an additive to the coating material when needed. With such an additive mixed therewith, a dielectric constant smaller or greater than the dielectric constant of resin can be obtained. Thus, it is possible to easily obtain the dielectric constant between about 1.5 and about 10.

The multilayered LC filter described above defines the equivalent circuit of a band pass filter as shown in FIG. 3. Specifically, an inductance $L_1$ of the inductor electrode 4a and a trimming capacitance $Ct_1$, defined between the resonance capacitor electrode 7a and the trimming electrode 8 are connected in parallel between an input terminal and a ground terminal to constitute an LC parallel resonance circuit $Q_1$ on the input side.

Similarly, an inductance $L_2$ of the inductor electrode 4b and a trimming capacitance $Ct_2$, defined between the resonance capacitor electrode 7b and the trimming electrode 8 are connected in parallel between an output terminal and a ground terminal to constitute an LC parallel resonance circuit $Q_2$ on the input side. Between the inductor electrode 4a and the inductor electrode 4b there is generated a mutual inductance M, by which the LC parallel resonance circuits $Q_1$ and $Q_2$ are magnetically coupled to each other.

In addition, a capacitance generated by a capacitive coupling between the other end $6a_2$ of the input extraction electrode 6a and the resonance capacitance electrode 7a is connected in series between the input terminal and the ground terminal to constitute an input adjusting capacitance $C_1$. Similarly, a capacitance generated by a capacitive coupling between the other end $6b_2$ of the output extraction electrode 6b and the resonance capacitance electrode 7b is connected in series between the output terminal and the ground terminal to constitute an input adjusting capacitance $C_2$.

A capacitance between the other end $6a_2$ of the input extraction electrode 6a and the coupling capacitance electrode 5 and a capacitance between the other end $6b_2$ of the output extraction electrode 6b and the coupling capacitance electrode 5 are connected in series between the input terminal and the output terminal to constitute a coupling capacitor Cp.

Next, a method for adjusting the frequency of the multilayered LC filter of the present preferred embodiment will be illustrated below with reference to FIGS. 4 and 5.

The frequency adjustment method of the present preferred embodiment includes two steps including a primary adjustment and a secondary adjustment. In the primary adjustment, the frequency of the multilayered LC filter is roughly adjusted by forming isolated electrodes from a trimming electrode to reduce an obtained capacitance so that the capacitance is temporarily smaller than a desired capacitance predetermined when the circuit is designed. Then, in the secondary adjustment, the coating material is applied in isolated portions to make a fine adjustment so that the capacitance can be slightly increased.

First, the primary adjustment is performed as follows. A laser beam is applied onto a trimming electrode 8 provided on the multilayered body to form trimming grooves 8c and 8d having substantially V-formed sections in substantially rectangular shapes. With this arrangement, the trimming electrode 8 is divided into three electrodes including two insular electrodes 8e and 8f within the region of the trimming grooves 8c and 8d and a trimming electrode 8g left outside the trimming grooves 8c and 8d. In this situation, the primary adjustment is made. As a result, between a resonance capacitor electrode 7a and the trimming electrode 8, two capacitances are generated, that is, a capacitance $Ci_1$ between an insular electrode 8e and the resonance capacitor electrode 7a and a capacitance $Ct_1$ between the left trimming electrode 8g and the resonance capacitor electrode 7a. Similarly, between a resonance capacitor electrode 7b and the trimming electrode 8, two capacitances are generated, that is, a capacitance $Ci_2$ between the insular electrode 8f and a resonance capacitor electrode 7b and a capacitance $Ct_2$ between the left trimming electrode 8g and the resonance capacitor electrode 7b.

In the primary adjustment, in order to temporarily make the capacitance smaller than the desired capacitance, considerations are given for the shapes, sizes, widths, and depths of the trimming grooves, and other characteristics. The capacitance value obtained in the primary adjustment is preferably close to the value of a desired capacitance so that it can be adjusted in the following secondary adjustment.

Next, after a coating material 9 having a predetermined thickness is applied on the substantially entire top surface of the multilayered body, heat hardening, or preferably, UV hardening is performed to add the coating material 9 for the secondary adjustment. When the coating material 9 is added, the coating material 9 is filled in the trimming grooves 8c and 8d. As a result, inside the trimming grooves 8c and 8d as gaps, the coating material 9 having a desired dielectric constant is filled. Thus, there are newly formed minute capacitances $Cf_1$ and $Cf_2$, which are greater than a space 14, between the insular electrodes 8e and 8f and the left trimming electrode 8g, which are mutually opposing electrodes in the surface direction.

Consequently, a trimming capacitance $Ct_1$, between the resonance capacitor electrode 7a and the trimming electrode 8 is substantially equivalent to a synthesized capacitance of the capacitance $Ci_1$ between the insular electrode 8e and the resonance capacitor electrode 7a, the capacitance $Ct_1$ between the left trimming electrode 8g and the resonance capacitor electrode 7a, and the capacitance $Cf_1$ between the insular electrode 8e and the left trimming electrode 8g. The value of the capacitance $Ct_1$, is obtained by the following equation. Additionally, the value of a trimming capacitance $Ct_2$, generated between the resonance capacitor electrode 7b and the trimming electrode 8 is obtained in the same manner.

$$Ct_{1'} = Ct_1 + \frac{Cf_1 \cdot Ci_1}{Cf_{1'} \cdot Ci_1} \qquad \text{EQUATION 1}$$

In the above preferred embodiment, the coating material 9 is preferably applied on the substantially entire top surface of the multilayered body. However, the coating material 9 may be applied only on portions having significant influences on the capacitances. For example, the coating material 9 may be filled in only inside the trimming grooves 8c and 8d, or alternatively, may be applied only inside the trimming grooves 8c and 8d and the adjacent portions on the grooves. Additionally, instead of filling the coating material 9 in the entire trimming grooves 8c and 8d, the coating material 9 may be filled in only some portions of the trimming grooves 8c and 8d to partially generate capacitances between the insular electrodes 8e and 8f and the trimming electrode 8g.

As a method for applying the coating material 9, in order to make a fine adjustment of the capacitance, the coating material 9 is repeatedly applied. For example, it may be applied two times to change the thickness of the applied coating material 9. In this case, in the first application, the coating material 9 may be filled in only inside the trimming grooves 8c and 8d, and in the second application, the coating material 9 may be applied only onto the adjacent portions on the trimming grooves 8c and 8d, or may be applied to coat the entire trimming electrode 8.

Furthermore, when each of the trimming grooves 8c and 8d has a substantially V-formed sectional shape, the capacitance adjustments can be performed more finely according to the amount of the filled coating material 9. The sectional shape of each groove is not restricted to the V-formed shape. For example, it may be a substantially U-formed shape.

Figure 6:
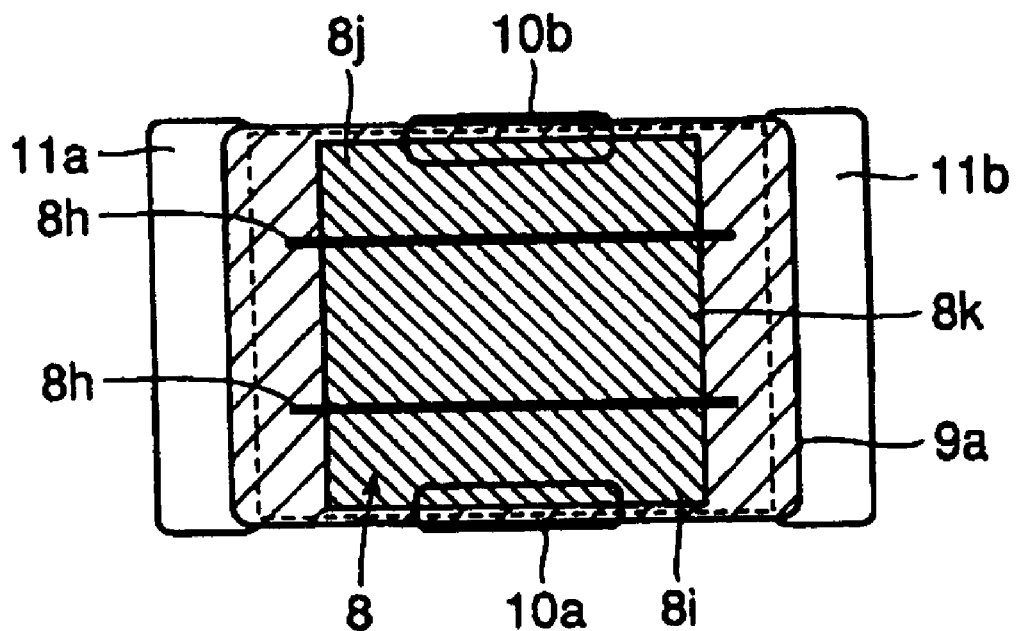
FIG. 6 show a schematic plan view illustrating a multilayered LC filter according to another preferred embodiment of the invention.

FIG. 6 shows a schematic plan view illustrating another preferred embodiment of the invention. In the preferred embodiment shown in FIG. 6, an insular electrode isolated from a trimming electrode is formed by arranging two linear trimming grooves 8h on the top surface of a multilayered body in a direction connecting an input external electrode 11a and an output external electrode 11b in substantially parallel to each other. With this arrangement, the trimming electrode 8 is divided into three electrodes including an external electrode 8i connected to a ground external electrode 10a on the front side of the multilayered body, an external electrode 8j connected to a ground external electrode 10b on the back side of the multilayered body, and a central electrode 8k disposed as a floating electrode in the approximate center of the multilayered body. A coating material 9a is applied on substantially the entire top surface of the multilayered body. In addition, a trimming capacitance $Ct_1$, between the trimming electrode 8 and the resonance capacitor electrode 7a and a trimming capacitance $Ct_2$, between the trimming electrode 8 and the resonance capacitor electrode 7b are the same as those shown in FIG. 5.

Figure 7:
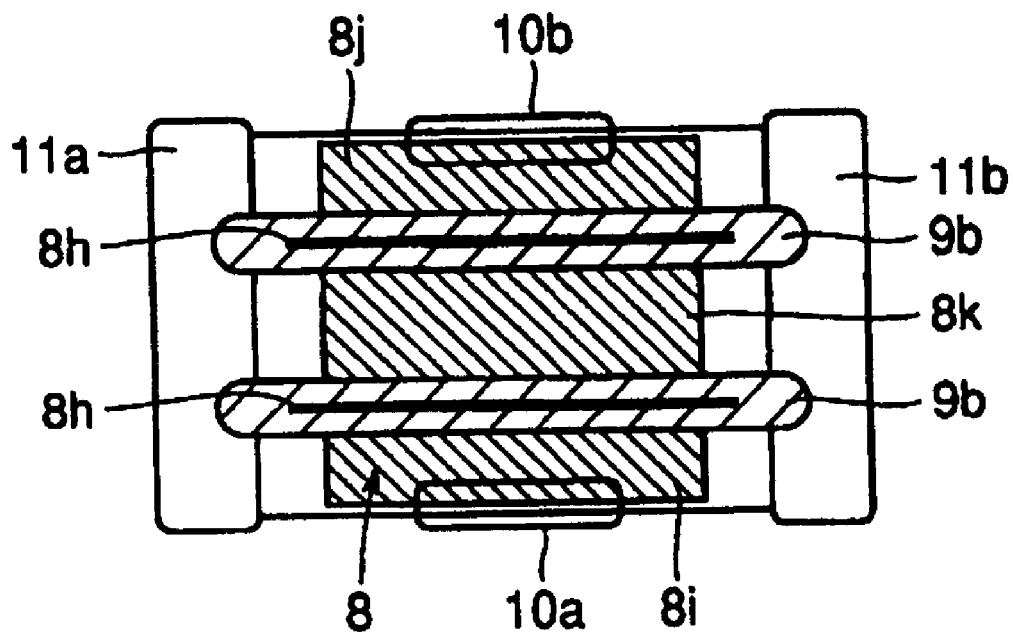
FIG. 7 shows a schematic plan view illustrating a multilayered LC filter according to another preferred embodiment of the invention.

In FIG. 7, without applying the coating material 9a on the entire top surface of the multilayered body as shown in FIG. 6, a coating material 9b is applied preferably to coat only the trimming grooves 8h and the adjacent portions. With such coating, since it is only necessary to coat resin required for the frequency adjustments, the adjustment can be efficiently made.

While preferred embodiments of the invention have been described above, the multilayered LC composite component according to the present invention and the method for adjusting the frequency of the component used in the invention are not restricted to the above-described preferred embodiments. Various modifications and changes can be made within the scope and spirit of the invention. For example, each of the external electrodes may not necessarily be disposed on the surfaces of the multilayered body. Alternatively, the external electrodes may be disposed on the top and bottom surfaces of the multilayered body via an electrically connecting method such as the formation of through-holes. In addition, in each of the above-described preferred embodiments, after laminating the dielectric sheets, the laminated sheets have been integrally burned. However, the present invention is not restricted to this method. For example, the multilayered LC composite component may be formed as follows. After applying and drying a paste dielectric material by printing or other method to form a dielectric film, the paste dielectric material is applied on the obtained dielectric film and the material is dried to form an electric film. Through the sequential application of the dielectric material, there can be obtained a LC filter having the multilayer structure. In addition, resin films or other insulation members may be used as the dielectric sheets 2. Also, dielectric members to be used may be burned in advance.

As described above, in various preferred embodiments of the present invention, when the frequency of the multilayered LC composite component is adjusted, the two steps of the primary and secondary adjustments are performed. In the primary adjustment, the capacitance is temporarily made smaller than the desired capacitance to make a rough adjustment. In the secondary adjustment, in order to increase the capacitance slightly, the coating material is filled in the trimming grooves so that a fine adjustment is performed. With this method, the fine adjustment for obtaining a desired frequency can be performed. As a result, the present invention can provide the multilayered LC composite component having more satisfactory frequency characteristics.

While the present invention has been described with reference to what is presently considered to be the preferred embodiment, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A multilayered LC composite component comprising:
   a multilayered body including a plurality of dielectric layers and internal electrodes having capacitor electrodes and an Inductor electrode laminated via the dielectric layers;
   input/output external electrodes and a ground external electrode disposed on a surface of the multilayered body;
   a trimming electrode disposed on a surface of the multilayered body such that the trimming electrode is opposed to at least one of the internal electrodes and electrically connected to the ground external electrode;
   a trimming groove provided in the surface of the multilayered body;
   an isolated electrode that is isolated from the trimming electrode by the trimming groove;
   a coating material filled in the trimming groove to adjust to a desired frequency the coating material having a dielectric constant smaller than the dielectric constant of the dielectric layers, and wherein the isolated electrode is surrounded by the trimming electrode via the trimming electrode.

2. A multilayered LC composite component according to claim 1, wherein the coating material has a dielectric constant between about 1.5 and about 10.

3. A multilayered LC composite component according to claim 1, wherein the trimming electrode is disposed on substantially the entire top surface of the dielectric sheet on which it is disposed.

4. A multilayered LC composite component according to claim 1, wherein the trimming groove has a substantially rectangular shape in the region of the trimming electrode.

5. A multilayered LC composite component according to claim 1, further comprising at least one additional isolated electrode that is isolated from the trimming electrode such that the isolated electrode and the at least one additional isolated electrode are floating electrodes electrically disconnected from the ground external electrode.

6. A multilayered LC composite component according to claim 1, wherein the coating material includes at least one of acrylic resin, epoxy resin, and silicone resin.

7. A multilayered LC composite component according to claim 1, wherein the coating material further includes at least one of a hardening agent and an accelerator.

8. A multilayered LC composite component according to claim 1, wherein the multilayered LC composite component defines a band pass filter.

9. A method for adjusting the frequency of a multilayered LC composite component including the steps of:
   providing a multilayered body including a plurality of dielectric layers and internal electrodes having capacitor electrodes and an inductor electrode laminated via the dielectric layers, input/output external electrodes and a ground external electrode disposed on a surface of the multilayered body, a trimming electrode disposed on a surface of the multilayered body such that the trimming electrode is opposed to at least one of the internal electrodes and electrically connected to the ground external electrode;
   making a primary adjustment in which a trimming groove is formed in the trimming electrode to form an isolated electrode that is separated from the trimming electrode so that a capacitance between the trimming electrode and the internal electrode is reduced to be smaller than a capacitance for a desired frequency; and
   making a secondary adjustment in which a coating material having a dielectric constant smaller than the dielectric constant of the dielectric layers is filled in the trimming groove to slightly increase a capacitance between the trimming electrode and the isolated electrode so as to finely adjust to the desired frequency.

10. The method according to claim 9, wherein the step of making the primary adjustment includes applying a laser beam onto the trimming electrode to form a plurality of trimming grooves.

11. The method according to claim 10, wherein the step of applying a laser beam is performed such that the trimming grooves have substantially V-formed sections in substantially rectangular shapes.

12. The method according to claim 10, wherein the step of applying a laser beam is performed such that the trimming electrode is divided into three electrodes including the isolated electrode and an additional isolated electrode within the region of the trimming grooves and a trimming electrode located outside of the trimming grooves.

13. The method according to claim 9, wherein in the step of making the secondary adjustment, the coating is applied on the substantially entire top surface of the multilayered body.

14. The method according to claim 9, wherein in the step of making the secondary adjustment, the coating is applied only on portions of the top surface of the multilayered body.

15. The method according to claim 9, wherein in the step of making the secondary adjustment, the coating is applied so as to fill the trimming groove.

16. The method according to claim 9, wherein in the step of making the secondary adjustment, the coating is applied in only portions of the trimming groove.

17. The method according to claim 9, wherein in the step of making the secondary adjustment, the coating is repeatedly applied in several steps.

18. The method according to claim 9, wherein the isolated electrode is surrounded by the trimming electrode via the trimming groove.

19. The method according to claim 9, wherein the coating material has a dielectric constant between about 1.5 and about 10.

* * * * *